(12) United States Patent
Ibe et al.

(10) Patent No.: US 11,226,553 B2
(45) Date of Patent: Jan. 18, 2022

(54) PHOTO-IMPRINTING CURABLE COMPOSITION AND PATTERN TRANSFERRING METHOD USING THE SAME

(71) Applicant: DIC Corporation, Tokyo (JP)

(72) Inventors: Takeshi Ibe, Sakura (JP); Makoto Yada, Sakura (JP)

(73) Assignee: DIC Corporation, Tokyo (JP)

( * ) Notice: Subject to any disclaimer, the term of this patent is extended or adjusted under 35 U.S.C. 154(b) by 95 days.

(21) Appl. No.: 16/077,265

(22) PCT Filed: Apr. 25, 2017

(86) PCT No.: PCT/JP2017/016300
§ 371 (c)(1),
(2) Date: Aug. 10, 2018

(87) PCT Pub. No.: WO2017/195586
PCT Pub. Date: Nov. 16, 2017

(65) Prior Publication Data
US 2019/0041745 A1 Feb. 7, 2019

(30) Foreign Application Priority Data
May 11, 2016 (JP) .............................. JP2016-095302

(51) Int. Cl.
| | | |
|---|---|---|
| *G03F 7/00* | (2006.01) | |
| *C08F 283/12* | (2006.01) | |
| *C08F 2/48* | (2006.01) | |
| *C08L 83/10* | (2006.01) | |
| *G03F 7/027* | (2006.01) | |
| *G03F 7/075* | (2006.01) | |
| *C08F 299/08* | (2006.01) | |
| *C08L 53/00* | (2006.01) | |
| *H01L 21/027* | (2006.01) | |
| *C08F 220/20* | (2006.01) | |
| *C08F 212/14* | (2006.01) | |
| *C08F 220/58* | (2006.01) | |
| *C08F 226/02* | (2006.01) | |
| *C08G 77/442* | (2006.01) | |
| *C08F 222/38* | (2006.01) | |
| *C08F 220/28* | (2006.01) | |

(52) U.S. Cl.
CPC .............. *G03F 7/0002* (2013.01); *C08F 2/48* (2013.01); *C08F 283/126* (2013.01); *C08F 299/08* (2013.01); *C08L 53/00* (2013.01); *C08L 83/10* (2013.01); *G03F 7/027* (2013.01); *G03F 7/0755* (2013.01); *H01L 21/0271* (2013.01); *C08F 212/14* (2013.01); *C08F 220/20* (2013.01); *C08F 220/281* (2020.02); *C08F 220/58* (2013.01); *C08F 222/385* (2013.01); *C08F 226/02* (2013.01); *C08G 77/442* (2013.01)

(58) Field of Classification Search
None
See application file for complete search history.

(56) References Cited

U.S. PATENT DOCUMENTS

| | | | | |
|---|---|---|---|---|
| 8,231,218 B2* | 7/2012 | Hong | ............... | B29D 11/00067 351/159.02 |
| 2004/0054106 A1* | 3/2004 | Ito | ............... | C08F 8/12 526/279 |
| 2005/0218536 A1* | 10/2005 | Quinn | ............... | B29D 11/00317 264/1.7 |
| 2007/0120279 A1* | 5/2007 | Linhardt | ............... | B29D 11/00 264/1.7 |
| 2007/0296914 A1* | 12/2007 | Hong | ............... | G02C 7/049 351/159.04 |

(Continued)

FOREIGN PATENT DOCUMENTS

| | | |
|---|---|---|
| CN | 103392221 A | 11/2013 |
| CN | 103503115 A | 1/2014 |

(Continued)

OTHER PUBLICATIONS

Bodratti et al. "Formulation of Poloxamers for Drug Delivery" Journal of Functional Biomaterials, 2018, 9(11), 24 pages. (Year: 2018).*

(Continued)

*Primary Examiner* — Robert S Loewe
(74) *Attorney, Agent, or Firm* — Locke Lord LLP; James E. Armstrong, IV; Nicholas J. DiCeglie, Jr.

(57) ABSTRACT

An object of the present invention is to provide an imprinting curable composition which includes a silicon-containing polymerizable compound such as polysiloxane, exhibits outstanding adhesion to a substrate and excellent demoldability from a fine pattern mold, and causes very little mold contamination. The object is attained by providing a photo-imprinting curable composition including a polymerizable compound (A) containing a silicon atom in the molecule, a photopolymerization initiator (B) and an additive (C), the additive (C) being a compound represented by the following formula (C1) or (C2):

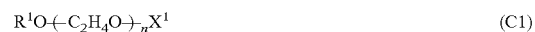

(C1)

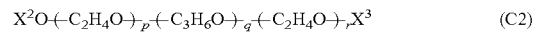

(C2)

(In the formula (C1), $R^1$ is a $C_{12\text{-}30}$ alkyl group, $X^1$ is a hydrogen atom or an acyl group, and n is an integer of 0 to 50. In the formula (C2), $X^2$ and $X^3$ are each independently a hydrogen atom or an acyl group, and p, q and r are each independently an integer of 1 to 50).

4 Claims, No Drawings

(56) References Cited

U.S. PATENT DOCUMENTS

| | | | | |
|---|---|---|---|---|
| 2008/0073804 | A1* | 3/2008 | Matsuzawa | B29D 11/00192 264/2.6 |
| 2008/0094570 | A1* | 4/2008 | Kamiya | G02B 1/043 351/159.01 |
| 2008/0176049 | A1* | 7/2008 | Ro | B82Y 10/00 428/195.1 |
| 2008/0277826 | A1* | 11/2008 | Chou | G03F 7/0002 264/293 |
| 2009/0061039 | A1* | 3/2009 | Zhang | B29C 33/3857 425/436 R |
| 2010/0009137 | A1* | 1/2010 | Kodama | B82Y 10/00 428/195.1 |
| 2010/0140114 | A1* | 6/2010 | Pruitt | A61K 9/0051 206/5.1 |
| 2010/0213636 | A1* | 8/2010 | Schmidt | B29C 37/0028 264/275 |
| 2010/0256313 | A1* | 10/2010 | Nakamura | C08L 63/00 525/476 |
| 2011/0086221 | A1* | 4/2011 | Pokorny | C09J 7/29 428/336 |
| 2011/0143330 | A1* | 6/2011 | Shimada | B43L 1/00 434/408 |
| 2011/0163482 | A1* | 7/2011 | Ro | C08F 2/48 264/496 |
| 2011/0183127 | A1* | 7/2011 | Kodama | G03F 7/033 428/195.1 |
| 2013/0136818 | A1 | 5/2013 | Uehara et al. | |
| 2014/0037900 | A1* | 2/2014 | Takihara | B29C 59/02 428/141 |
| 2014/0061970 | A1 | 3/2014 | Sekine et al. | |
| 2014/0175685 | A1* | 6/2014 | Huang | B29D 11/00192 264/2.6 |
| 2014/0216538 | A1 | 8/2014 | Kato et al. | |
| 2015/0321445 | A1 | 11/2015 | Kobayashi et al. | |
| 2016/0187774 | A1 | 6/2016 | Ito et al. | |
| 2016/0370503 | A1* | 12/2016 | Jan | B29D 11/00038 |
| 2017/0306062 | A1* | 10/2017 | Ibe | B32B 15/085 |

FOREIGN PATENT DOCUMENTS

| | | | | |
|---|---|---|---|---|
| CN | 104246975 A | | 12/2014 | |
| JP | 2009084395 A | * | 4/2009 | ............ C08F 220/24 |
| JP | 2010-018666 A | | 1/2010 | |
| JP | 2012-186464 A | | 9/2012 | |
| JP | 2012-195610 A | | 10/2012 | |
| TW | 201511926 A | | 4/2015 | |
| WO | 2012/018043 A1 | | 2/2012 | |

OTHER PUBLICATIONS

Irving A. Schmolka "A Review of Block Polymer Surfactants" Journal of the American Oil Chemists' Society 54, 110-116, 1977. (Year: 1977).*

Machine translation of JP-2009084395, 76 pages, translation generated Jul. 2020. (Year: 2020).*

International Search Report dated Aug. 8, 2017, issued for PCT/JP2017/016300.

T. Ito, "Nanoimprint System Development and Status for High Volume Semiconductor Manufacturing," The Japan Society of Applied Physics, Textbook of 2nd workshop, 2015, Nanoimprint Technology Study Group, published Jul. 24, 2015, pp. 8-12 and information sheets. (discussed in the spec).

J. Taniguchi et al.,"Nano Inpurinto Ni Okeru Rikei Mondai No Hyouka To Sono Taisaku (Investigation and approaches to demold problems in nanoimprinting)," Technology Direction Series, Realize Science & Engineering, published May 20, 2010, pp. 56-59 and information sheets. (discussed in the spec).

Notification of First Office Action and Search Report issued in corresponding Chinese Patent Application No. CN201780029089.6, dated Jul. 5, 2020.

First Office Action issued in corresponding Taiwanese Patent Applicaiton No. TW 10920508620, dated Jun. 1, 2020.

* cited by examiner

PHOTO-IMPRINTING CURABLE COMPOSITION AND PATTERN TRANSFERRING METHOD USING THE SAME

TECHNICAL FIELD

The present invention relates to an imprinting curable composition which exhibits outstanding adhesion to a substrate, can be demolded without incurring pattern defects or pattern collapse, and causes very little contamination on a pattern mold, and to a pattern forming method using the composition.

BACKGROUND ART

Nanoimprinting is an advanced version of embossing well known in optical disc fabrication. In this technique, a mold having a fine unlevel pattern is pressed into a resin to mechanically deform the resin, thereby precisely transferring the pattern. In particular, photo-nanoimprinting transfers a pattern while photocuring a photocurable composition by the application of light through a transparent mold or a transparent substrate. This imprinting process is feasible at room temperature and is therefore expected to offer enhancements in dimensional stability and throughput. The process is economically efficient because once a mold is fabricated, nanostructures on the order of ten to several hundreds of nm can be repeatedly produced with ease. Further, this nano process generates less wastes and emissions that are harmful. In recent years, the photo-nanoimprinting is expected to be applied into various fields on account of those benefits described above.

In, for example, optical applications such as antireflection films, some of the performances required of fine unlevel patterns formed by the photo-nanoimprinting process are transparency, heat resistance, weather resistance and durability. In resist applications, the properties that are required include acid resistance, solvent resistance and dry etching resistance. Polysiloxane components exhibit distinctive properties that are not possessed by organic materials. On account of this fact, photocurable compositions containing polysiloxane components are being studied for application in nanoimprinting. Some example applications that have been reported are nanoimprinting resin molds which require transparency, durability and low surface energy, and nanoimprint resists which are subjected to plasma etching based on oxygen gas (Patent Literatures 1 and 2).

The biggest challenge in the photo-nanoimprinting process is demold defects which are encountered when a photocurable composition being pressed by a mold is photocured and separated from the mold. Some demold defects are pattern collapse, pattern loss, substrate separation, incomplete filling, and dust or bubble defects. In general, demoldability is deteriorated with increasing fineness of the mold pattern and increasing aspect ratio. Attempts have been recently made in which nanoimprinting is applied to the semiconductor field. The studies which are underway set the objective defect density to as low as 1 defect/cm$^2$ in the transferring of an ultrafine pattern having a pattern width of 20 nm or less (Non Patent Literature 1).

An approach to improving the demoldability in nanoimprinting is to control the affinity between a nanoimprinted cured resin product obtained by curing a photocurable composition, and the surface of a mold in contact therewith. For example, Non Patent Literature 2 reports that the mold surface is release-treated with a fluorine-containing silane coupling agent so as to reduce the work of adhesion between the mold and a nanoimprinted cured resin product which are in contact with each other, thus attaining enhanced demoldability. Further, Patent Literature 3 reports an imprint material which contains a fluorine surfactant serving to reduce the adhesion with respect to a mold. Patent Literature 4 discloses that a lubricant is added to an imprinting curable composition.

The release treatment on the mold surface, however, is disadvantageous in terms of throughput on account of the fact that the treatment deteriorates the wettability of the mold with a photocurable composition and the composition takes a longer time to fill the mold. The release treatment on the mold is not practical also in view of the fact that the release treatment on an ultrafine mold causes incomplete filling or nonuniform size of a transferred pattern. The approach in which a fluorine surfactant is added to an imprint material is problematic in that, for example, the surfactant adheres to the mold during continuous transferring and the advanced contamination causes gradual loss of mold wettability. The addition of a lubricant is not a satisfactory approach because of the mold contamination problem in continuous demolding and also because the curable composition decreases its adhesion with respect to an underlying film and the pattern tends to separate. Further, a curable composition based on a polysiloxane component has a low elastic modulus due to the high flexibility of siloxane bonds, and consequently 100 nm or finer patterns or patterns with a high aspect ratio collapse easily.

CITATION LIST

Patent Literature

PTL 1: International Publication No. WO 2012/018043
PTL 2: Japanese Unexamined Patent Application Publication No. 2012-186464
PTL 3: Japanese Unexamined Patent Application Publication No. 2012-195610
PTL 4: Japanese Unexamined Patent Application Publication No. 2010-018666

Non Patent Literature

NPL 1: The Japan Society of Applied Physics, Textbook of 2nd workshop, 2015, Nanoimprint Technology Study Group, pp. 8-12, published Jul. 24, 2015
NPL 2: NANO INPURINTO NI OKERU RIKEI MONDAI NO HYOUKA TO SONO TAISAKU (Investigation and approaches to demold problems in nanoimprinting) (REALIZE Science & Engineering), published May 20, 2010

SUMMARY OF INVENTION

Technical Problem

As discussed above, approaches to improving the demoldability in nanoimprinting have been heretofore studied. However, none has been successful in obtaining a composition which contains a polysiloxane component, exhibits high adhesion to a substrate, can be demolded from a fine pattern mold without incurring pattern defects or pattern collapse, and causes less mold contamination. An object of the present invention is to provide an imprinting curable composition which includes a silicon-containing polymerizable compound such as polysiloxane, exhibits outstanding adhesion to a substrate and excellent demoldability from a fine pattern mold, and causes very little mold contamination.

Solution to Problem

As a result of extensive studies, the present inventors have found that the above object can be attained by a photo-imprinting curable composition which comprises a polymerizable compound containing a silicon atom in the molecule, a photopolymerization initiator and a specific additive. The present invention has been completed based on the finding.

The present invention pertains to the following items 1 to 15.

Item 1. A photo-imprinting curable composition comprising a polymerizable compound (A) containing a silicon atom in the molecule, a photopolymerization initiator (B) and an additive (C), the additive (C) being a compound represented by the following formula (C1) or (C2):

[Chem. 1]

   Formula (C1)

[Chem. 2]

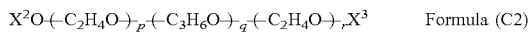   Formula (C2)

In the formula (C1), $R^1$ is a $C_{12\text{-}30}$ alkyl group, $X^1$ is a hydrogen atom or an acyl group, and n is an integer of 0 to 50. In the formula (C2), $X^2$ and $X^3$ are each independently a hydrogen atom or an acyl group, and p, q and r are each independently an integer of 1 to 50.

Item 2. The photo-imprinting curable composition described in Item 1, wherein $R^1$ in the formula (C1) is a $C_{16\text{-}30}$ alkyl group.

Item 3. The photo-imprinting curable composition described in Item 1 or 2, wherein the HLB value of the compound represented by the formula (C1) is not more than 10.

Here, the HLB value is represented by $(M_{EO}/(M_{R1}+M_{EO}))\times 20$ wherein $M_{R1}$ and $M_{EO}$ are the formula weights of the group $R^1$ and the polyethylene oxide unit, respectively, in the compound represented by the formula (C1).

Item 4. The photo-imprinting curable composition described in any one of Items 1 to 3, wherein n in the formula (C1) is 0.

Item 5. The photo-imprinting curable composition described in any one of Items 1 to 4, wherein $X^1$ in the formula (C1) is an acryloyl group or a methacryloyl group.

Item 6. The photo-imprinting curable composition described in Item 1, wherein the value represented by $M_{EO}/(M_{EO}+M_{PO})$ of the compound of the formula (C2) is 0.1 to 0.4.

(Here, $M_{EO}$ is the formula weight of the polyethylene oxide units in the formula (C2), and $M_{PO}$ is the formula weight of the polypropylene oxide unit in the formula (C2).)

Item 7. The photo-imprinting curable composition described in Item 1 or 6, wherein in the formula (C2), $X^2$ is an acryloyl group or a methacryloyl group, and $X^3$ is an acryloyl group or a methacryloyl group.

Item 8. The photo-imprinting curable composition described in any one of Items 1 to 7, wherein the content of the additive (C) is 0.1 to 5 wt %.

Item 9. The photo-imprinting curable composition described in Item 1, wherein the polymerizable compound (A) is a polysiloxane having two or more polymerizable functional groups.

Item 10. The photo-imprinting curable composition described in Item 9, wherein the polymerizable functional group present in the polymerizable compound (A) is an ethylenically unsaturated bond.

Item 11. The photo-imprinting curable composition described in any one of Items 1 to 10, further comprising a solvent (D).

Item 12. A photo-imprinting curable composition used in an imprint pattern forming method comprising a step of applying the photo-imprinting curable composition described in any one of Items 1 to 11 onto a substrate, a step of pressing an imprinting mold into the composition, the imprinting mold having an unlevel pattern on a surface thereof, a step of curing the photo-imprinting curable composition, and a step of separating the imprinting mold.

Item 13. The photo-imprinting curable composition described in Item 12, wherein the surface with the pattern of the imprinting mold is not covered with a release layer.

Item 14. The photo-imprinting curable composition described in any one of Items 1 to 13, which is used for a resist.

Item 15. A pattern transferring method comprising a step of arranging a patterned object onto a workpiece, the patterned object comprising a cured product of the photo-imprinting curable composition described in any one of Items 1 to 14, a step of etching the workpiece while using the cured product as an etching mask, and a step of transferring a pattern to the workpiece.

Advantageous Effects of Invention

The photo-imprinting curable composition of the present invention attains marked effects of outstanding substrate adhesion, demoldability without pattern defects or pattern collapse, and very little contamination on a pattern mold.

DESCRIPTION OF EMBODIMENTS

<Polymerizable Compounds (A)>

The polymerizable compound (A) in the present invention is not particularly limited as long as the polymerizable compound has a silicon atom in the molecule. From the point of view of curability, a compound having a polysiloxane structure with two or more polymerizable functional groups is preferable. It is more preferable that the polymerizable functional group be an ethylenically unsaturated bond. Dry etching resists are an example application which takes advantage of the distinctive performance of the polysiloxane component. For the composition to be favorably used in this application, the amount of silicon atoms in the compound is preferably not less than 15 wt %, and more preferably not less than 20 wt %. Examples of the polymerizable compounds (A) in the invention will be described below.

The polymerizable compounds (A) in the invention are available as commercial products, with specific examples including X-22-174ASX, X-22-174BX, KF-2012, X-22-2426, X-22-2475, X-22-2445, X-22-1602, X-22-164, X-22-164AS, X-22-164A, X-22-164B, X-22-164C, X-22-164E, KR-513, X-40-2672B, X-40-9272B (all manufactured by Shin-Etsu Chemical Co., Ltd.), AC-SQ TA-100, MAC-SQ TM-100, AC-SQ SI-20, MAC-SQ SI-20, and MAC-SQ HDM (all manufactured by TOAGOSEI CO., LTD.).

The polymerizable compound (A) of the invention may be synthesized using a commercial raw material having a (meth)acrylate group. Examples of the commercial raw materials having a (meth)acrylate group include 3-acryloyloxypropyl trimethoxysilane, 3-acryloyloxypropyl triethoxysilane, 3-methacryloyloxypropyl trimethoxysilane, 3-acryloyloxypropyl trichlorosilane, 2-methacryloyloxypropyl methyldimethoxysilane, 2-hydroxyethyl acrylate, 2-hydroxyethyl methacrylate, 2-hydroxyethyl acrylate, hydroxypropyl acrylate, 4-hydroxybutyl acrylate, allyl acrylate and allyl methacrylate.

The polymerizable compound (A) of the invention may be synthesized by any known and conventional method without limitation. For example, a raw material compound having a polymerizable unsaturated group and an alkoxysilane group may be subjected to sol gel reaction to form a polysiloxane structure. Alternatively, the compound may be synthesized by dehydrochlorination of raw materials which include a compound having a polymerizable unsaturated group and a hydroxyl group, and a silicone compound having a SiCl group. Still alternatively, the compound may be synthesized by transesterification of raw materials which include a compound having a polymerizable unsaturated group and a hydroxyl group, and a silicone compound having an alkoxysilane group. Alternatively, the compound may be synthesized by hydrosilylation of raw materials which include a compound having a plurality of vinyl groups, and a silicone compound having a SiH group. Some example methods for the synthesis of the polymerizable compounds (A) of the invention will be described below, but the polymerizable compounds (A) of the invention are not limited to such compounds.

<Examples of Compounds Having Vinyl Polymer Segment and Polysiloxane Segment Chemically Bonded in Graft Structure or Block Structure>

The polymerizable compound (A) of the invention may be chemically bonded to a silicon-free segment as long as a silicon atom is present in the resultant molecule. For example, the compound may have a graft structure in which a polysiloxane segment is chemically bonded as a side chain to a vinyl polymer segment, or the compound may have a block structure in which a vinyl polymer segment and a polysiloxane segment are chemically bonded together. For example, the compound may have a vinyl polymer segment and a polysiloxane segment bonded together via a structure represented by the general formula (1).

[Chem. 3]

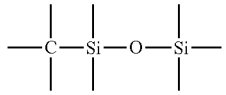

General Formula (1)

Examples of the vinyl polymer segments include such vinyl polymer segments as acrylic polymers, vinyl ester polymers, aromatic vinyl polymers and polyolefin polymers. The vinyl polymer segments are obtained by polymerizing or copolymerizing general (meth)acrylic monomers. The (meth)acrylic monomers are not particularly limited, and may be copolymerized with vinyl monomers. Examples include alkyl (meth)acrylates having a $C_{1-22}$ alkyl group such as methyl (meth)acrylate, ethyl (meth)acrylate, n-propyl (meth)acrylate, n-butyl (meth)acrylate, isobutyl (meth) acrylate, tert-butyl (meth)acrylate, 2-ethylhexyl (meth)acrylate and lauryl (meth)acrylate; aralkyl (meth)acrylates such as benzyl (meth)acrylate and 2-phenylethyl (meth)acrylate; cycloalkyl (meth)acrylates such as cyclohexyl (meth)acrylate, isobornyl (meth)acrylate, dicyclopentenyl (meth)acrylate, dicyclopentenyloxyethyl (meth)acrylate, dicyclopentanyl (meth)acrylate and adamantyl (meth)acrylate; ω-alkoxyalkyl (meth)acrylates such as 2-methoxyethyl (meth)acrylate and 4-methoxybutyl (meth)acrylate; vinyl aromatics such as styrene, α-methylstyrene, o-methylstyrene, m-methylstyrene, p-methylstyrene, 1,3-dimethylstyrene, vinylnaphthalene and vinylanthracene; vinyl carboxylate esters such as vinyl acetate, vinyl propionate, vinyl pivalate and vinyl benzoate; alkyl esters of crotonic acid such as methyl crotonate and ethyl crotonate; dialkyl esters of unsaturated dibasic acids such as dimethyl maleate, di-n-butyl maleate, dimethyl fumarate and dimethyl itaconate; α-olefins such as ethylene and propylene; alkyl vinyl ethers such as ethyl vinyl ether and n-butyl vinyl ether; cycloalkyl vinyl ethers such as cyclopentyl vinyl ether and cyclohexyl vinyl ether; and tertiary amide group-containing monomers such as N,N-dimethyl(meth)acrylamide, N-(meth)acryloylmorpholine, N-(meth)acryloylpyrrolidine and N-vinylpyrrolidone.

The vinyl polymer segment may be copolymerized with a compound having, in the molecule, a vinyl-containing organic functional group and a silicon-bonded hydrolyzable group, and the silicon-bonded hydrolyzable group may be used as a graft point. The hydrolysis reaction of the silicon-bonded hydrolyzable group followed by dehydration condensation reaction affords a compound in which the polysiloxane segment is bonded via the structure represented by the general formula (1). The compounds having a vinyl-containing organic functional group and a silicon-bonded hydrolyzable group in the molecule are not particularly limited, with examples including vinyltrimethoxysilane, vinyltriethoxysilane, p-styryltrimethoxysilane, 3-methacryloxypropyldimethoxysilane, 3-methacryloxypropyltrimethoxysilane, 3-methacryloxypropylmethyldiethoxysilane, 3-methacryloxypropyltriethoxysilane and 3-acryloxypropyltrimethoxysilane.

The polymerization methods, solvents or polymerization initiators used in the copolymerization of the above monomers are not particularly limited, and the vinyl polymer segments may be obtained by known methods. For example, the vinyl polymer segments may be obtained by various polymerization methods such as bulk radical polymerization, solution radical polymerization and nonaqueous dispersion radical polymerization, using polymerization initiators such as 2,2'-azobis(isobutyronitrile), 2,2'-azobis(2,4-dimethylvaleronitrile), 2,2'-azobis(2-methylbutyronitrile), tert-butyl peroxypivalate, tert-butyl peroxybenzoate, tert-butyl peroxy-2-ethylhexanoate, di-tert-butyl peroxide, cumene hydroperoxide and diisopropyl peroxycarbonate.

The polysiloxane segment may be obtained by, for example, the hydrolysis reaction and subsequent dehydration condensation reaction of a compound having, in the molecule, an organic functional group and a silicon-bonded, detachable or hydrolyzable group. The compounds having an organic functional group and a silicon-bonded, detachable or hydrolyzable group in the molecule may be general such compounds and are not particularly limited, with examples including methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropyldimethoxysilane, 3-methacryloxypropyltrimethoxysilane, 3-methacryloxypropylmethyldiethoxysilane, 3-methacryloxypropyltriethoxysilane, and 3-acryloxypropyltrimethoxysilane. The polymerizable compound (A) has polymerizability. To introduce a polymerizable functional group in the molecule, it is preferable to copolymerize any of, for example, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropyldimethoxysilane, 3-methacryloxypropyltrimethoxysilane, 3-methacryloxypropylmethyldiethoxysilane, 3-methacryloxypropyltriethoxysilane, and 3-acryloxypropyltrimethoxysilane.

<Examples of Compounds which Contain Polymerizable Functional Group-Containing Group Q and Silicon Atom in Molecule>

The polymerizable compound (A) of the invention may be a compound which contains a polymerizable functional group-containing group Q represented by the following general formula (2), and which contains a silicon atom in the molecule.

—O—R²—Y  General Formula (2)

In the general formula (2), the oxygen atom is bonded to a silicon atom, Y is a polymerizable functional group, and R² denotes an unsubstituted or substituted $C_{1-25}$ alkyl group optionally containing a heteroatom or denotes a direct bond.

The polymerizable functional group in the polymerizable functional group-containing group Q may be, for example, a radical polymerizable functional group. Specific examples of the radical polymerizable functional groups include vinyl group, (meth)acryloyl group, allyl group, isopropenyl group, styryl group, vinyloxy group, vinyloxycarbonyl group, vinylcarbonyl group and N-vinylamino group, with (meth)acryloyl group being particularly preferable. The polymerizable functional group-containing group Q may be any group which contains the above polymerizable functional group.

Examples of the polymerizable functional group-containing groups Q represented by the general formula (2) include the following structures.

[Chem. 4]

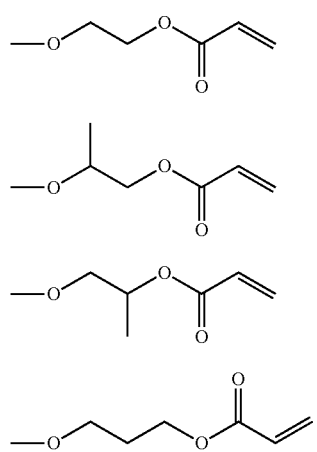

Q-1

Q-2

Q-3

Q-4

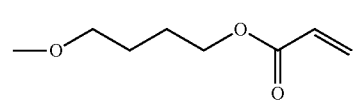

Q-5

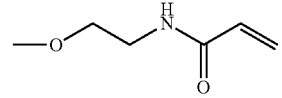

Q-6

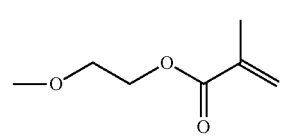

Q-7

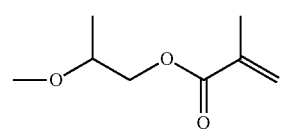

Q-8

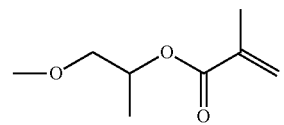

Q-9

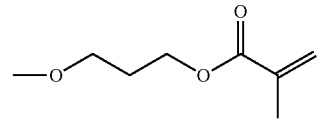

Q-10

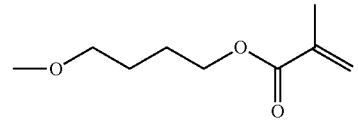

Q-11

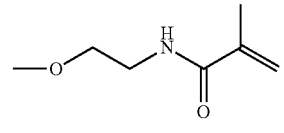

Q-12

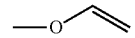

Q-13

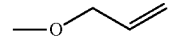

Q-14

Q-15

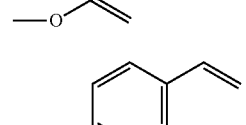

Q-16

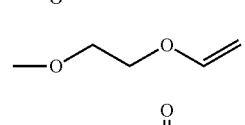

Q-17

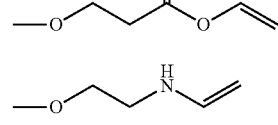

Q-18

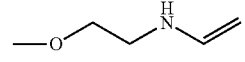

Q-19

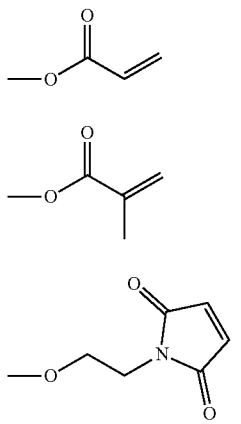
For example, the polymerizable compound (A) of the invention may be linear or branched. The following structures may be mentioned as examples.
[Chem. 5]
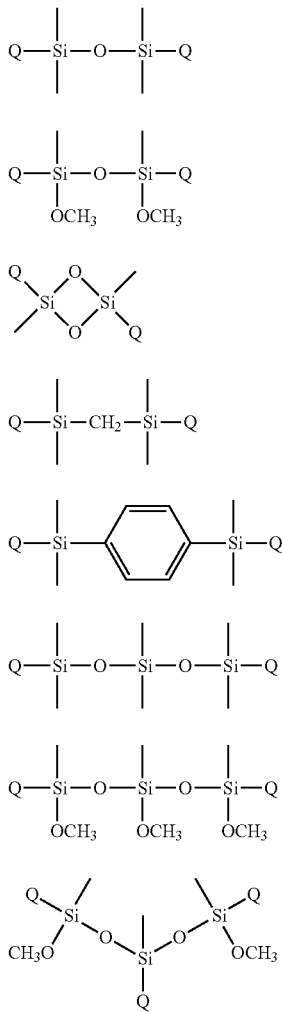
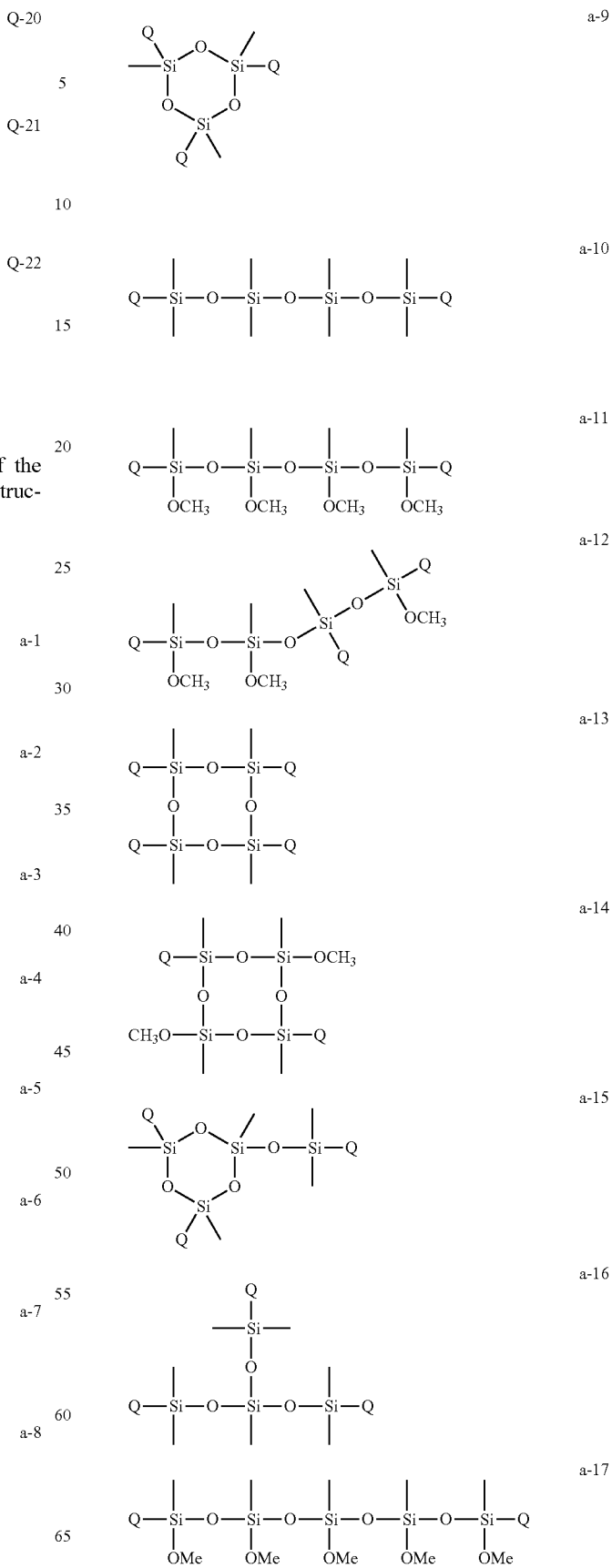

a-18 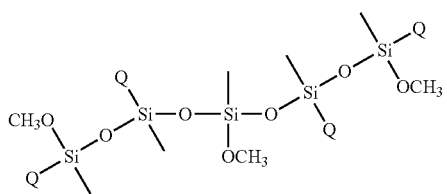

a-19 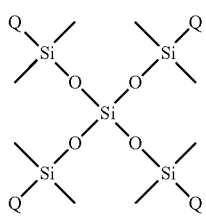

a-20 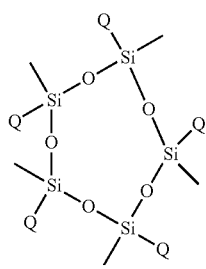

a-21 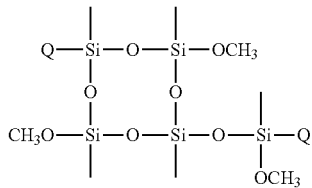

a-22 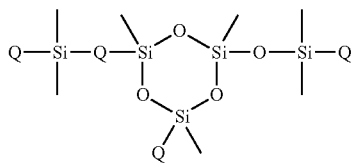

a-23 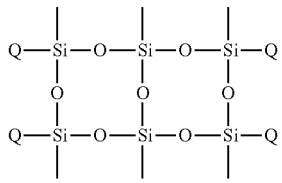

a-24 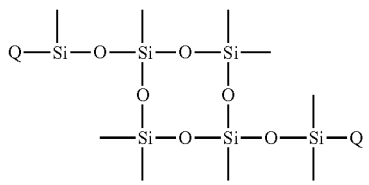

a-25, a-26 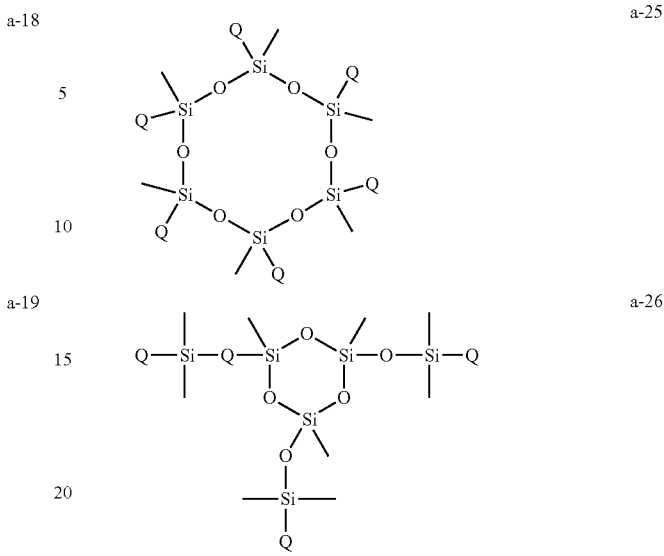

Dry etching resists are an example application which takes advantage of the distinctive performance of the polysiloxane component. For the composition to be favorably used in this application, it is preferable that the polymerizable compound (A) be a structure having 5 or more silicon atoms. When the molecule contains 5 or more silicon atoms, products formed on the surface by dry etching are prevented from detachment and volatilization.

<Polymerizable Compounds Having No Silicon Atoms in Molecule>

In addition to the polymerizable compound (A) containing a silicon atom in the molecule, the curable composition of the present invention may include a polymerizable compound having no silicon atoms in the molecule as long as the characteristic performance of the polysiloxane component (for example, dry etching resistance) is not impaired. The polymerizable group contained in the silicon-free polymerizable compound is preferably one that is reactive with the polymerizable group present in the silicon-containing polymerizable compound (A). When, for example, the polymerizable group in the silicon-containing polymerizable compound (A) is a (meth)acryloyl group, it is preferable that the polymerizable group contained in the silicon-free polymerizable compound be also a (meth)acryloyl group.

In the present specification, the term "(meth)acryloyl" refers to either or both of "acryloyl" and "methacryloyl".

Specific examples of the polymerizable compounds having no silicon atoms in the molecule include hydroxyethyl (meth)acrylate, hydroxypropyl (meth)acrylate, hydroxybutyl (meth)acrylate, polyethylene glycol mono(meth)acrylate, polypropylene glycol mono(meth)acrylate, benzyl (meth)acrylate, phenylbenzyl (meth)acrylate, phenoxybenzyl (meth)acrylate, phenol EO-modified (meth)acrylate, o-phenylphenol EO-modified (meth)acrylate, para-cumylphenol EO-modified (meth)acrylate, nonylphenol EO-modified (meth)acrylate, monohydroxyethyl phthalate (meth)acrylate, 2-hydroxy-3-phenoxypropyl (meth)acrylate, 2-(phenylthio)ethyl (meth)acrylate, cyclohexyl (meth)acrylate, tetrahydrofurfuryl (meth)acrylate, dicyclopentenyl (meth)acrylate, dicyclopentenyloxyethyl (meth)acrylate, dicyclopentanyl (meth)acrylate, isobornyl (meth)acrylate, adamantyl (meth)acrylate, 1,2-ethanediol di(meth)acrylate, 1,2-propanediol di(meth)acrylate, 1,4-butanediol di(meth)

acrylate, 1,6-hexanediol di(meth)acrylate, dipropylene glycol di(meth)acrylate, neopentyl glycol di(meth)acrylate, tripropylene glycol di(meth)acrylate, trimethylolpropane di(meth)acrylate, trimethylolpropane tri(meth)acrylate, tris (2-(meth)acryloyloxy) isocyanurate, pentaerythritol tri(meth)acrylate, pentaerythritol tetra(meth)acrylate, di(trimethylolpropane) tetra(meth)acrylate, di(pentaerythritol) penta(meth)acrylate, di(pentaerythritol) hexa(meth)acrylate, tricyclodecanedimethanol di(meth)acrylate, ethylene oxide-added bisphenol A di(meth)acrylate, ethylene oxide-added bisphenol F di(meth)acrylate, propylene oxide-added bisphenol A di(meth)acrylate, propylene oxide-added bisphenol F di(meth)acrylate and di(meth)acrylate having a 9,9-bisphenylfluorene skeleton.

The content of the silicon-free polymerizable compound is preferably not more than 20 wt %, and more preferably not more than 10 wt % relative to the polymerizable compound (A). When the content is 20 wt % or less, the acid resistance, weather resistance and dry etching resistance which are characteristics of the silicon-containing polymerizable compound are not deteriorated.

<Photopolymerization Initiators (B)>

Specific examples of the photopolymerization initiators (B) used in the present invention include 2,2-dimethoxy-1,2-diphenylethan-1-one, 1-hydroxy-cyclohexyl-phenyl-ketone, 1-[4-(2-hydroxyethoxy)-phenyl]-2-hydroxy-2-methyl-1-propan-1-one, 2-methyl-1-[4-(methylthio)phenyl]-2-morpholinopropan-1-one, 2-benzyl-2-dimethylamino-1-(4-morpholinophenyl)-butanone-1, bis(2,4,6-trimethylbenzoyl)-phenylphosphine oxide, 2-hydroxy-1-{4-[4-(2-hydroxy-2-methyl-propionyl)-benzyl]-phenyl}-2-methyl-propane, 1,2-octanedione, 1-[4-(phenylthio)-2-(O-benzoyloxime)], 2-hydroxy-2-methyl-1-phenyl-propan-1-one, phenylglyoxylic acid methyl ester, and 2,4,6-trimethylbenzoyl-diphenyl-phosphine oxide. However, the photopolymerization initiators are not particularly limited as long as having an absorption in the light source used in the photocuring. The photopolymerization initiators may be used singly, or two or more may be used in combination.

The compounds described above are available as commercial products, with examples including IRGACURE (registered trademark) series 651, 184, 2959, 907, 369, 379, 819, 127, OXE01 and 02, DAROCUR (registered trademark) series 1173, MBF and TPO (all manufactured by BASF Japan), and ESACURE (registered trademark) series KIP150, TZT, KTO46, 1001M, KB1, KS300, KL200, TPO, ITX and EDB (all manufactured by Nihon SiberHegner K. K.).

The content of the photopolymerization initiator (B) in the curable composition of the invention is preferably 0.5 to 20 wt %, and more preferably 1 wt % to 10 wt % relative to the polymerizable compound (A). When the content is 0.5 wt % or above, the curability is enhanced and excellent pattern formability is attained.

<Additives (C)>

The additive (C) used in the present invention may be suitably a compound represented by the following formula (C1) or (C2). More preferably, a compound represented by the following formula (C1) may be used.

[Chem. 6]

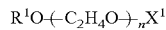    Formula (C1)

(In the formula, $R^1$ is a $C_{12-30}$ alkyl group, $X^1$ is a hydrogen atom or an acyl group, and n is an integer of 0 to 50.)

[Chem. 7]

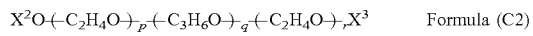    Formula (C2)

(In the formula, $X^2$ and $X^3$ are each independently a hydrogen atom or an acyl group, and p, q and r are each independently an integer of 1 to 50.)

In the formula (C1), $R^1$ is a $C_{12-30}$ alkyl group, and preferably a $C_{16-30}$ alkyl group.

$X^1$ is a hydrogen atom or an acyl group, preferably an acyl group, and more preferably an acyl group having a polymerizable functional group. Particularly preferably, $X^1$ is an acryloyl group or a methacryloyl group.

The letter n denotes an integer of 0 to 50, preferably 0 to 20, more preferably 0 to 10, and particularly preferably 0.

From the point of view of demoldability, it is preferable to use a compound of the formula (C1) having an HLB value of not more than 10. Such a compound having an HLB value of not more than 10 shows a molecular fastener effect which causes the alkyl groups $R^1$ to attract one another so as to form a dense layer of the additive (C1) at the interface between the curable composition and the mold, thus giving rise to a decrease in separation energy required for demolding. Thus, the curable composition that is obtained exhibits excellent demoldability. Here, the HLB value is represented by $(M_{EO}/(M_{R1}+M_{EO}))\times 20$ wherein $M_{R1}$ and $M_{EO}$ are the formula weights of the group $R^1$ and the polyethylene oxide unit, respectively, in the compound represented by the formula (C1).

In the formula (C2), $X^2$ and $X^3$ are each independently a hydrogen atom or an acyl group, preferably an acyl group, and more preferably an acyl group having a polymerizable functional group. Particularly preferably, $X^2$ and $X^3$ are each independently an acryloyl group or a methacryloyl group.

From the point of view of demoldability, it is preferable to use a compound of the formula (C2) having a value represented by "$M_{EO}/(M_{EO}+M_{PO})$" of not less than 0.1 and not more than 0.4. When the value represented by "$M_{EO}/(M_{EO}+M_{PO})$" is 0.1 or above, the compound exhibits amphiphilic properties and the additive (C2) tends to be segregated at the interface between the curable composition and the mold. When the value represented by "$M_{EO}/(M_{EO}+M_{PO})$" is 0.4 or less, more methyl groups of the polypropylene oxide unit come to be on the interface between the composition and the mold, giving rise to a decrease in separation energy required for demolding. Thus, the curable composition that is obtained exhibits excellent demoldability. Here, $M_{EO}$ is the formula weight of the polyethylene oxide units in the formula (C2), and $M_{PO}$ is the formula weight of the polypropylene oxide unit in the formula (C2).

The content of the additive (C) in the curable composition of the invention is preferably 0.1 to 5 wt % of the curable composition, and is more preferably 0.2 to 3 wt %, and still more preferably 0.3 to 2 wt %. When the content is 0.1 wt % or above, a sufficient amount of the additive (C) is segregated at the interface between the curable composition and the mold, and the curable composition exhibits excellent demoldability.

The curable composition of the present invention may further include a solvent (D). By the addition of a solvent, the viscosity of the curable composition can be adjusted. Examples of the solvents include aliphatic or alicyclic hydrocarbons such as n-hexane, n-heptane, n-octane, cyclohexane and cyclopentane; aromatic hydrocarbons such as toluene, xylene, ethylbenzene and anisole; alcohols such as methanol, ethanol, n-butanol, ethylene glycol monomethyl ether, propylene glycol monomethyl ether and propylene glycol monoethyl ether; esters such as ethyl acetate, n-butyl acetate, isobutyl acetate, ethylene glycol monomethyl ether acetate and propylene glycol monomethyl ether acetate; ketones such as acetone, methyl ethyl ketone, methyl isobutyl ketone and cyclohexanone; alkyl ethers; ethers such as 1,2-dimethoxyethane, tetrahydrofuran and dioxane; N-methylpyrrolidone, dimethylformamide and dimethylacetamide. The solvents may be used singly, or two or more may be used in combination.

When used, the solvent (D) may be added in such an amount that the content of the components except the solvent will be in the range of 0.1 to 100 wt % of the curable composition.

The curable composition of the present invention may include other components while still achieving the advantageous effects of the invention. Some example components are organic pigments, inorganic pigments, extender pigments, organic fillers, inorganic fillers, photosensitizers, UV absorbers, antioxidants and adhesion aids.

<Use as Resist Materials>

The curable composition of the invention may be used for a resist. A resist material comprising the curable composition of the invention may be cured to give a resist film. A patterned resist film may be obtained by a step of forming a pattern in a resist material comprising the curable composition of the invention, and a step of irradiating the patterned layer with light.

A resist material comprising the curable composition of the invention is applied onto a substrate and is patterned. The material may be applied onto a substrate by any method without limitation. Various methods may be used such as spraying, spin coating, dipping, roll coating, blade coating, doctor roll coating, doctor blade coating, curtain coating, slit coating, screen printing and inkjetting.

Where a pattern is formed using a mold, a mold having a predetermined pattern is pressed into a film formed by the aforementioned method, and the film is cured while being in contact with the mold to form a patterned resist film. The resist material may be favorably used to form a pattern with a size of, in particular, 100 nm or less.

Some example materials for the imprinting molds are light transmissive materials such as quartz, UV-transparent glass, sapphire, diamond, silicone materials including polydimethylsiloxane, cycloolefin resins, and other light transmissive resin materials. Where the substrate that is used is transmissive to light, the imprinting mold may be one made of a lightproof material. Examples of the lightproof materials include metals, SiC and mica. A quartz mold is particularly preferable on account of the fact that it favorably transmits UV light, and has high hardness and high surface smoothness. The shape of the imprinting mold may be selected from, among others, planar shapes, belts, rolls and roll belts without limitation.

Where the mold is one made of a light transmissive material, the curable composition may be cured by applying light through the mold. Where the substrate includes a light transmissive material, the curing may be effected by the application of light through the substrate. The light used for irradiation is not limited as long as it activates the photopolymerization initiator. In particular, light having a wavelength of 450 nm or less (active energy radiations such as UV light, X rays and γ rays) is preferable because the photopolymerization initiator is activated easily and the curing can take place at a lower temperature.

In the case where the composition has a difficulty in following the contour of the pattern to be formed, heating may be performed, during the irradiation, to a temperature which allows the composition to exhibit sufficient fluidity. The heating temperature is preferably 0 to 300° C., more preferably 0 to 200° C., still more preferably 0 to 150° C., and particularly preferably 25 to 80° C. In this temperature range, the shape of the pattern formed of the curable composition is maintained with high accuracy.

After the curing, the mold is separated to leave a resist film having an unlevel pattern imprinted by the unlevel pattern of the mold. To obtain a transferred pattern without defects or collapse, the demolding step is preferably performed in such a manner that the mold is elevated in a direction perpendicular to the substrate while precisely controlling the demolding speed to about 1 to 10000 μm/sec.

If resist residues are seen on the mold that has been separated, the mold is cleaned. Because the mold is used repeatedly, resist residues sitting on the mold adversely affect the pattern formation that follows.

Some example cleaning liquids used for mold cleaning are acids, alkalis and hot water. Examples of the acid cleaning liquids include sulfuric acid, hydrochloric acid, nitric acid, carbonic acid, acetic acid, phosphoric acid, aqua regia, diluted hydrofluoric acid, sulfuric acid hydrogen peroxide mixture, and hydrochloric acid hydrogen peroxide mixture. Examples of the alkali cleaning liquids include inorganic alkalis such as caustic alkalis including sodium hydroxide and potassium hydroxide, and various silicate salts, phosphate salts and carbonate salts, organic alkalis such as tetramethylammonium hydroxide, ammonia water, ammonia hydrogen water, and ammonia hydrogen peroxide mixture. Since an alkali cleaning liquid can dissolve $SiO_2$, an acid cleaning liquid, in particular, sulfuric acid hydrogen peroxide mixture, is preferable for a glass or quartz mold. A quartz mold, in particular, one having a 100 nm or finer pattern, has a risk of losing its rectangularity by the $SiO_2$ dissolving action of an alkali cleaning liquid. In this case, the use of an acid cleaning liquid allows the mold to be cleaned without damages to the fine pattern and thus to be used repeatedly.

The cleaning method is not particularly limited. Examples thereof include spraying, showering, soaking, hot soaking, ultrasonic soaking, spinning, bubbling, shaking, brushing, steaming and polishing. Spinning is particularly preferable to prevent the re-attachment of contaminants that have been removed.

The resist film thus obtained constitutes a stack by being disposed on a substrate. The substrate for forming the stack may be selected in accordance with various use applications. Examples thereof include quartz, sapphire, glass, plastics, ceramic materials, deposited films (CVD, PVD, sputtering), magnetic films, reflective films, metal substrates such as Ni, Cu, Cr, Fe and stainless steel, paper, SOG (spin on glass), SOC (spin on carbon), polymer substrates such as polyester films, polycarbonate films and polyimide films, TFT array substrates, PDP electrode plates, conductive substrates such as ITO and metals, insulating substrates, and semiconductor manufacturing substrates such as silicon, silicon nitride, polysilicon, silicon oxide and amorphous silicon.

The substrate may be one for a double-layer resist which has a second resist layer and a lower base plate. The combination that makes the substrate for a double-layer resist is not particularly limited. Examples of the materials of the second resist layer include metal masks such as Cr, Al and Ni, phenol resins such as novolak resins, vinyl resins such as hydroxyvinylnaphthalene copolymers and polyvinylphenol copolymers, polycyclic aromatic resins such as nortricyclene copolymers, indene copolymers, acenaphthylene copolymers and fullerene derivatives, SOC layers including, for example, cured products of the above resins, and amorphous carbon films formed by CVD. The substrate may be a stack of a plurality, for example, three or four, of layers of dissimilar materials. The resist film obtained using the curable composition of the invention may be used as a lower film.

The shape of the substrate is not particularly limited and may be any shape appropriate to the purpose, with examples including flat plates, sheets, and three-dimensional shapes having a curvature in the entirety or a portion thereof. Other properties such as hardness and thickness of the substrate are not limited.

To obtain a stack using the curable composition of the present invention, the resist material may be applied onto a substrate and cured in-situ to form a resist film. Alternatively, a resist film may be formed on a temporary substrate, separated therefrom, and attached to a substrate to form a stack. Where the resist film is a patterned film, dry etching of the stack transfers the pattern into the substrate, resulting in a patterned object.

Because the resist film obtained above has outstanding dry etching resistance, the geometry such as pattern thereof is not destroyed during dry etching. Thus, the etching pattern, even as fine as nano size, can be transferred to the substrate.

The dry etching may involve any of known gases such as, for example, oxygen atom-containing gases such as oxygen, carbon monoxide and carbon dioxide, inert gases such as helium, nitrogen and argon, chlorine-containing gases such as chlorine and boron trichloride, fluorine gas, fluorocarbon gas, hydrogen gas and ammonia gas. These gases may be used singly, or may be mixed appropriately. Because the resist film that is obtained contains much silicon, it may be favorably used in dry etching with oxygen gas alone or a mixture gas based on oxygen gas. The desired pattern can be formed on the substrate by performing etching using the above etching gases.

EXAMPLES

Next, the present invention will be described more concretely based on EXAMPLES and COMPARATIVE EXAMPLES. In the following, "parts" and "%" are on weight basis unless otherwise mentioned.

Hereinbelow, the present invention will be described in greater detail. However, it should be construed that the scope of the invention is not limited to EXAMPLES below.

Synthetic Example 1

[Preparation of Polymerizable Compound (A-1)]

A reaction vessel equipped with a stirrer, a thermometer, a dropping funnel, a condenser tube and a nitrogen gas inlet port was loaded with 20.1 parts phenyltrimethoxysilane, 24.4 parts dimethyldimethoxysilane and 107.7 parts n-butyl acetate. With nitrogen gas aeration, the temperature was increased to 80° C. while performing stirring. Next, with nitrogen gas aeration and while performing stirring at the temperature, a mixture containing 14.5 parts methyl methacrylate, 2 parts n-butyl methacrylate, 105 parts cyclohexyl methacrylate, 7.5 parts acrylic acid, 4.5 parts 3-methacryloyloxypropyl trimethoxysilane, 15 parts 2-hydroxyethyl methacrylate, 15 parts n-butyl acetate and 6 parts tert-butyl peroxy-2-ethylhexanoate was added dropwise to the reaction vessel over a period of 4 hours. Stirring was further performed at the temperature for 2 hours. Thereafter, a mixture containing 0.05 parts isopropyl phosphate and 12.8 parts deionized water was added dropwise to the reaction vessel over a period of 5 minutes. The resultant mixture was stirred at the temperature for 4 hours to perform the hydrolysis condensation reaction of phenyltrimethoxysilane, dimethyldimethoxysilane and 3-methacryloyloxypropyl trimethoxysilane. 1H-NMR analysis of the reaction product showed that substantially 100% of the trimethoxysilyl groups in the silane monomers in the reaction vessel had been hydrolyzed. Next, stirring was performed at the temperature for 10 hours to afford a vinyl polymer as the reaction product having a residual TBPEH content of not more than 0.1%. Next, 162.5 parts methyl-containing silicone resin KR-515 (trade name, manufactured by Shin-Etsu Chemical Co., Ltd.) was added to 307 parts of the vinyl polymer obtained above. The mixture was stirred for 5 minutes. Thereafter, 27.5 parts deionized water was added, and stirring was performed at 80° C. for 4 hours to perform the hydrolysis condensation reaction of the reaction product and the polysiloxane. The resultant reaction product was distilled at a reduced pressure of 10 to 300 kPa and 40 to 60° C. for 2 hours, and thereby the by-produced methanol and water were removed. Next, 150 parts methyl ethyl ketone (MEK) and 27.3 parts n-butyl acetate were added. Consequently, 600 parts of a polymerizable compound (A-1) having a nonvolatile content of 50.0% was obtained.

Synthetic Example 2

[Preparation of Polymerizable Compound (A-2)]

Methyl-containing silicone resin KR-500 (trade name, manufactured by Shin-Etsu Chemical Co., Ltd.) (110.8 parts), 2-hydroxyethyl acrylate (58.1 parts) and para-toluenesulfonic acid monohydrate (0.034 parts) were mixed together and heated to 120° C. The reaction was performed for 3 hours while performing stirring and distilling away methanol resulting from the condensation reaction. Thus, 153.9 parts of a polymerizable monomer (A-2) was obtained.

The compound obtained had the following properties and was thus confirmed to be a polymerizable compound having a silicon atom in the molecule. $^1$H-NMR (300 MHz, CDCl$_3$) δ (ppm): 6.43 (m, CH=C), 6.13 (m, C=CH—C=O), 5.83 (m, CH=C), 4.25 (br, CH$_2$—O—C=O), 3.96 (br, CH$_2$—O—Si), 3.50 (s, Si—OCH$_3$), 0.15 (s, Si—CH$_3$). The weight average molecular weight was measured to be 1650.

[Preparation of Curable Compositions]

Compositions of the present invention and comparative compositions were prepared by blending components based on the formulations in Table 1 described later, and further adding 4-methoxyphenol as a polymerization inhibitor in an amount of 200 ppm relative to the polymerizable monomers. The compositions were filtered through a tetrafluoroethylene membrane filter having a pore size of 0.2 μm. Curable compositions were thus prepared. In the table, the amounts are shown in weight ratio.

<Polymerizable Compounds A>

A-1: compound obtained in SYNTHETIC EXAMPLE 1
A-2: compound obtained in SYNTHETIC EXAMPLE 2
A-3: AC-SQ TA-100 (manufactured by TOAGOSEI CO., LTD.)
A-4: X-22-164 (manufactured by Shin-Etsu Chemical Co., Ltd.)

<Photopolymerization Initiator B>

B-1: IRGACURE 369 manufactured by BASF

<Additives C-1>

C1-1: BLEMMER SA (stearyl acrylate, manufactured by NOF CORPORATION)
C1-2: BLEMMER PSE-200 (stearoxy-polyethylene glycol-methacrylate, manufactured by NOF CORPORATION)

C1-3: BLEMMER PSE-1300 (stearoxy-polyethylene glycol-methacrylate, manufactured by NOF CORPORATION)

C1-4: BLEMMER PLE-1300 (lauroxy-polyethylene glycol-methacrylate, manufactured by NOF CORPORATION)

C1-5: octadecanol (manufactured by Wako Pure Chemical Industries, Ltd.)

C1-6: NONION S-202 (polyoxyethylene-stearyl ether, manufactured by NOF CORPORATION)

C1-7: NONION S-220 (polyoxyethylene-stearyl ether, manufactured by NOF CORPORATION)

C1-8: NOIGEN TDS-50 (polyoxyethylene-tridecyl ether, manufactured by DKS Co. Ltd.)

<Additives C-2>

C2-1: FANCRYL FA-023M (dimethacryloyl compound of polyethylene glycol-polypropylene glycol-polyethylene glycol block copolymer, manufactured by Hitachi Chemical Co., Ltd.)

C2-2: EPAN U-103 (polyethylene glycol-polypropylene glycol-polyethylene glycol block copolymer, manufactured by DKS Co. Ltd.)

C2-3: EPAN U-105 (polyethylene glycol-polypropylene glycol-polyethylene glycol block copolymer, manufactured by DKS Co. Ltd.)

<Comparative Compounds>

E-1: PEG #1000 (polyethylene glycol, manufactured by NOF CORPORATION)

E-2: MEGAFACE F-554 (oligomer containing a fluorine-containing group and a lipophilic group, manufactured by DIC CORPORATION)

E-3: NOIGEN XL-40 (polyoxyethylene-decyl ether, manufactured by DKS Co. Ltd.)

E-4: UNIOL D-1000 (polypropylene glycol, manufactured by NOF CORPORATION)

E-5: KF-4001 (long chain alkyl-modified silicone oil, manufactured by Shin-Etsu Chemical Co., Ltd.)

<Evaluations>

The following evaluations were performed on the curable compositions of EXAMPLES and COMPARATIVE EXAMPLES. The results are shown in Table 2.

<Pattern Forming Method>

The curable compositions from EXAMPLES 1 to 14 and COMPARATIVE EXAMPLES 1 to 6 were each diluted with propylene glycol monomethyl ether acetate solvent and spin coated onto a silicon wafer substrate so that the film thickness would be 1.0 μm. The coated substrate was set on a lower stage of nanoimprint device X300 manufactured by SCIVAX Corporation. The surface of a quartz mold (NIM PHL-45 manufactured by NTT Advanced Technology Corporation) having a 45-100 nm line/space pattern and a groove depth of 100 nm was cleaned with UV ozone cleaner, and the water contact angle of the mold surface was confirmed to be less than 10°. Thereafter, the mold was set on an upper stage of the device. The upper stage of the device was lowered to bring the mold into contact with the curable composition. The pressure was increased to 100 N in 10 seconds at room temperature and was held for 30 seconds to degas the film. With an LED light source having a peak wavelength of 365±5 nm, light was applied at 500 mJ/cm² through the backside of the mold, and the mold was separated by raising the upper stage at a speed of 1 mm/min. In this manner, a pattern was formed on the substrate. Patterns were transferred onto ten silicon wafer substrates repeatedly in the same manner using the same mold. The mold after the second and tenth transferring operations and the patterns obtained in these operations were evaluated in the following manners.

(Mold Blockage)

The mold after the patterning was observed on a scanning electron microscope with respect to a 45 nm line/space pattern region, and was evaluated based on the following criteria.

◯: No blockage was seen in the line/space pattern.

x: Blockage was seen in one or more sites in the line/space pattern.

(Mold Surface Contamination)

The mold after the patterning was set on contact angle meter Drop Master DM-500 manufactured by Kyowa Interface Science Co., LTD. At room temperature, a 2 μL droplet of deionized water was dropped, and the contact angle after 1 second was measured by the θ/2 method. The measurement was conducted five times in the same manner, and the average of the contact angles was evaluated based on the following criteria.

⊙: The contact angle was less than 10°.

◯: The contact angle was from 10° to less than 30°.

Δ: The contact angle was from 30° C. to less than 60°.

x: The contact angle was 60° or more.

[Pattern Collapse]

The pattern obtained by the pattern forming method described above was inspected for pattern collapse by the use of a scanning electron microscope with respect to a 45 nm line/space pattern region. Evaluation was made based on the following criteria.

●: There was no pattern collapse.

◯: Pattern collapse was seen in less than 2% of the total pattern area.

Δ: Pattern collapse was seen in 2 to less than 5% of the total pattern area.

x: Pattern collapse was seen in 5% or more of the total pattern area.

<Substrate Adhesion>

The curable compositions from EXAMPLES 1 to 14 and COMPARATIVE EXAMPLES 1 to 6 were each diluted with propylene glycol monomethyl ether acetate solvent and spin coated onto a silicon wafer substrate so that the film thickness would be 1.0 μm. In a nitrogen atmosphere (not more than 0.1% oxygen concentration), the coated substrate was irradiated with 500 mJ/cm² light from an LED light source having a peak wavelength of 365±5 nm, and the curable composition gave a cured film. The adhesion of the cured film with respect to the substrate was evaluated by a cross cut method (JIS K5600). A pattern consisting of twenty five lattices was cut into the cured film, and a pressure-sensitive adhesive tape was applied over the cut. After the pressure-sensitive adhesive tape was peeled, the test surface was observed and evaluated based on the following criteria.

◯: All the twenty five lattices were free from separation.

x: One or more of the twenty five lattices were separated.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|---|---|---|---|---|---|---|---|---|---|---|
| Polymerizable compounds (A) | A-1 | 100 | | | | 100 | 100 | 100 | 100 | 100 | 100 | 100 | 100 | 100 | 100 | 100 | 100 | 100 | 100 | 100 | 100 |
| | A-2 | | 100 | | | | | | | | | | | | | | | | | | |
| | A-3 | | | 100 | | | | | | | | | | | | | | | | | |
| | A-4 | | | | 100 | | | | | | | | | | | | | | | | |
| Photopolymerization initiator (B) | B-1 | 2 | 2 | 2 | 2 | 2 | 2 | 2 | 2 | 2 | 2 | 2 | 2 | 2 | 2 | 2 | 2 | 2 | 2 | 2 | 2 |
| Additives (C-1) | C1-1 | 1 | 1 | 1 | 1 | | | | | | | | | | | | | | | | |
| | C1-2 | | | | | 1 | | | | | | | | | | | | | | | |
| | C1-3 | | | | | | 1 | | | | | | | | | | | | | | |
| | C1-4 | | | | | | | 1 | | | | | | | | | | | | | |
| | C1-5 | | | | | | | | 1 | | | | | | | | | | | | |
| | C1-6 | | | | | | | | | 1 | | | | | | | | | | | |
| | C1-7 | | | | | | | | | | 1 | | | | | | | | | | |
| | C1-8 | | | | | | | | | | | 1 | | | | | | | | | |
| Additives (C-2) | C2-1 | | | | | | | | | | | | 1 | | | | | | | | |
| | C2-2 | | | | | | | | | | | | | 1 | | | | | | | |
| | C2-3 | | | | | | | | | | | | | | 1 | | | | | | |
| Comparative compounds | E-1 | 1 | | | | | | | | | | | | | | 1 | | | | | |
| | E-2 | 1 | | | | | | | | | | | | | | | 1 | | | | |
| | E-3 | 1 | | | | | | | | | | | | | | | | 1 | | | |
| | E-4 | | | | | | | | | | | | | | | | | | 1 | | |
| | E-5 | | | | | | | | | | | | | | | | | | | 1 | 1 |
| Number of carbon atoms in R1 | | 18 | 18 | 18 | 18 | 18 | 18 | 12 | 18 | 18 | 18 | 13 | | | | | | | 10 | | |
| HLB value | | 0 | 0 | 0 | 0 | 8.2 | 16.8 | 17.7 | 0 | 4.9 | 15.3 | 10.5 | | | | | | | 10.5 | | |
| n | | 0 | 0 | 0 | 0 | 4 | 30 | 30 | 0 | 2 | 20 | 5 | | | | | | | 4 | | |
| X1 | | Acryloyl group | Acryloyl group | Acryloyl group | Acryloyl group | Methacryloyl group | Methacryloyl group | Methacryloyl group | Hydrogen atom | Hydrogen atom | Hydrogen atom | Hydrogen atom | | | | | | | Hydrogen atom | | |
| $M_{EO}/(M_{EO} + M_{PO})$ | | — | — | — | — | — | — | — | — | — | — | — | 0.27 | 0.30 | 0.50 | — | — | — | — | — | — |
| X2 | | — | — | — | — | — | — | — | — | — | — | — | Methacryloyl group | Hydrogen atom | Hydrogen atom | — | — | — | — | — | — |
| X3 | | — | — | — | — | — | — | — | — | — | — | — | Methacryloyl group | Hydrogen atom | Hydrogen atom | — | — | — | — | — | — |

TABLE 2

| | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|---|---|---|---|---|---|---|---|---|---|
| Mold blockage (After 2nd patterning) | ○ | ○ | ○ | ○ | ○ | ○ | ○ | ○ | ○ | ○ | ○ | ○ | ○ | ○ | X | ○ | ○ | ○ | ○ | ○ |
| Mold blockage (After 10th patterning) | ○ | ○ | ○ | ○ | ○ | ○ | ○ | ○ | ○ | ○ | ○ | ○ | ○ | ○ | X | ○ | ○ | ○ | ○ | ○ |
| Mold surface contamination (After 2nd patterning) | ⊙ | ⊙ | ⊙ | ⊙ | ⊙ | ⊙ | ⊙ | ⊙ | ⊙ | ⊙ | ⊙ | ⊙ | ⊙ | ⊙ | Δ | ○ | X | ○ | ○ | Δ |
| Mold surface contamination (After 10th patterning) | ⊙ | ⊙ | ⊙ | ⊙ | ⊙ | ⊙ | ⊙ | ○ | ○ | ○ | ○ | ⊙ | ○ | ○ | Δ | Δ | X | Δ | Δ | X |
| Pattern collapse (After 2nd patterning) | ⊙ | ⊙ | ⊙ | ⊙ | ⊙ | ○ | ○ | ○ | ○ | ○ | ○ | ⊙ | ⊙ | ○ | X | Δ | ⊙ | Δ | Δ | ○ |
| Pattern collapse (After 10th patterning) | ⊙ | ⊙ | ⊙ | ⊙ | ○ | ○ | Δ | ⊙ | ○ | ○ | Δ | ○ | ○ | ○ | X | X | ⊙ | X | X | Δ |
| Substrate adhesion | ○ | ○ | ○ | ○ | ○ | ○ | ○ | ○ | ○ | ○ | ○ | ○ | ○ | ○ | ○ | ○ | X | ○ | ○ | X |

INDUSTRIAL APPLICABILITY

The curable compositions of the present invention may be used in various imprint techniques, and may be used particularly suitably to form nanosize fine patterns. Specifically, the curable compositions may be used in the manufacturing of semiconductor integrated circuits, microelectromechanical systems (MEMS), sensor devices, optical discs, magnetic recording media such as high density memory discs, optical components such as diffraction gratings and relief holograms, optical films and polarizing elements for the fabrication of nanodevices, optical devices and flat panel displays, thin film transistors, organic transistors, color filters, overcoat layers and microlens arrays in liquid crystal displays, immunoassay chips, DNA separation chips, microreactors, nanobiodevices, optical waveguides, optical filters, photonic liquid crystals, and 3D printed articles.

The invention claimed is:

1. A pattern transferring method comprising:
a step of arranging a patterned object onto a workpiece, the patterned object comprising a cured product of the photo-imprinting curable composition comprising a polymerizable compound (A) containing a silicon atom in the molecule, a photopolymerization initiator (B) and an additive (C), the additive (C) being a compound represented by the following formula (C1) or (C2):

R$^1$O$-$(C$_2$H$_4$O)$_n-$X$^1$    Formula (C1)

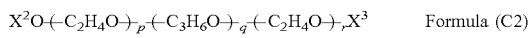

X$^2$O$-$(C$_2$H$_4$O)$_p-$(C$_3$H$_6$O)$_q-$(C$_2$H$_4$O)$_r-$X$^3$    Formula (C2)

in the formula (C1), R$^1$ is a C$_{12\text{-}30}$ alkyl group, X$^1$ is an acryloyl group or a methacryloyl group, and n is an integer of 0 to 50, and in the formula (C2), X$^2$ and X$^3$ are each independently a hydrogen atom or an acyl group, and p, q and r are each independently an integer of 1 to 50;
wherein the content of the additive (C) is 0.1 to 5 wt %; and
wherein the value represented by M$_{EO}$/(M$_{EO}$+M$_{PO}$) of the compound of the formula (C2) is 0.1 to 0.4, where M$_{EO}$ is the formula weight of the polyethylene oxide units in the formula (C2), and M$_{PO}$ is the formula weight of the polypropylene oxide unit in the formula (C2), a step of etching the workpiece while using the cured product as an etching mask, and a step of transferring a pattern to the workpiece.

2. A photo-imprinting curable composition used in an imprint pattern forming method comprising a step of applying the photo-imprinting curable composition described in claim 1 onto a substrate, a step of pressing an imprinting mold into the composition, the imprinting mold having an unlevel pattern on a surface thereof, a step of curing the photo-imprinting curable composition, and a step of separating the imprinting mold.

3. The photo-imprinting curable composition according to claim 2, wherein the surface with the pattern of the imprinting mold is not covered with a release layer.

4. The photo-imprinting curable composition according to claim 1, which is used for a resist.

* * * * *